(12) United States Patent
Meyer et al.

(10) Patent No.: US 9,309,147 B2
(45) Date of Patent: Apr. 12, 2016

(54) THERMOCHROMIC GLASS COMPRISING A COATING OF NEUTRAL-COLOUR VANADIUM DIOXIDE

(71) Applicant: JUSTUS-LIEBIG-UNIVERSITAET GIESSEN, Giessen (DE)

(72) Inventors: Bruno K. Meyer, Grossen-Linden (DE); Angelika Polity, Bad Nauheim (DE); Marc Konstantin Dietrich, Giessen (DE)

(73) Assignee: JUSTUS-LIEBIG-UNIVERSITAET GIESSEN, Giessen (DE)

( * ) Notice: Subject to any disclaimer, the term of this patent is extended or adjusted under 35 U.S.C. 154(b) by 0 days.

(21) Appl. No.: 14/409,989

(22) PCT Filed: Jun. 19, 2013

(86) PCT No.: PCT/EP2013/062770
§ 371 (c)(1),
(2) Date: Dec. 19, 2014

(87) PCT Pub. No.: WO2013/189996
PCT Pub. Date: Dec. 27, 2013

(65) Prior Publication Data
US 2015/0203398 A1 Jul. 23, 2015

(30) Foreign Application Priority Data

Jun. 21, 2012 (DE) .......................... 10 2012 012 219

(51) Int. Cl.
*B32B 9/00* (2006.01)
*B32B 13/00* (2006.01)
(Continued)

(52) U.S. Cl.
CPC ............... *C03C 17/06* (2013.01); *C03C 17/245* (2013.01); *C03C 17/347* (2013.01); *C03C 17/3411* (2013.01); *C03C 17/3452* (2013.01); *C09K 9/00* (2013.01); *C23C 14/34* (2013.01); *H01L 31/02168* (2013.01); *C03C 2217/24* (2013.01); *C03C 2217/262* (2013.01); *C03C 2217/70* (2013.01); *Y10T 428/31678* (2015.04)

(58) Field of Classification Search
CPC ..................... C03C 2217/21; C03C 2217/218; C03C 2217/24; C03C 17/06; C03C 17/245; C03C 17/3411; C03C 17/347; C03C 17/366; C23C 14/34
USPC ........ 428/701, 702; 65/529, 60.5; 204/192.29
See application file for complete search history.

(56) References Cited

U.S. PATENT DOCUMENTS 6,110,656 A * 8/2000 Eichorst et al. ............... 430/527
8,889,219 B2 * 11/2014 Granqvist et al. ......... 427/126.4
(Continued)

FOREIGN PATENT DOCUMENTS

DE 2114965 A1 1/1973
DE 3347918 C2 2/1989
(Continued)

OTHER PUBLICATIONS

Mlyuka et al., "Mg doping of thermochromic VO2 films enhances the optical transmittance and decreases the metal-insulator transition temperature", Applied Physics Letters, vol. 95, 2009, p. 171909-1-171909-3.*

(Continued)

*Primary Examiner* — Jonathan Langman
(74) *Attorney, Agent, or Firm* — Marshall, Gerstein & Borun LLP

(57) ABSTRACT

The invention relates to a coating of glass with thermochromic vanadium dioxide. The coloration of the vanadium dioxide is shifted from bronze to neutral (colorless) by a doping with alkaline earth metals, for example Ca, Sr and Br. The thermochromic effect is maintained at the same time.

10 Claims, 5 Drawing Sheets

Figure 1:
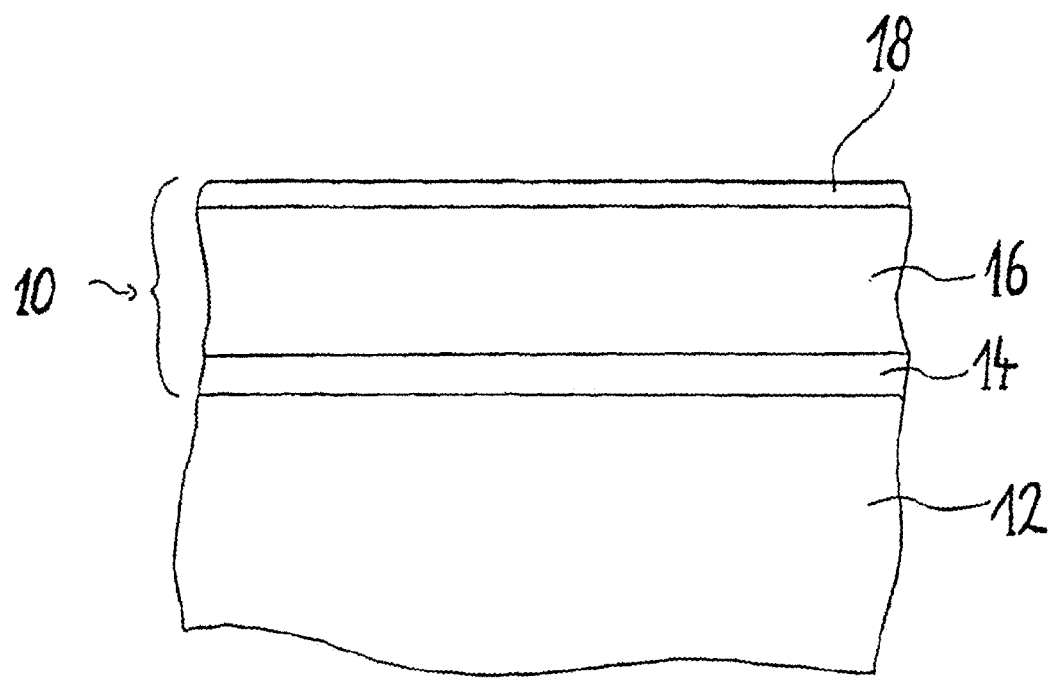

(51) Int. Cl.
  *B32B 19/00* (2006.01)
  *C03C 17/06* (2006.01)
  *C03C 17/34* (2006.01)
  *C03C 17/245* (2006.01)
  *C23C 14/34* (2006.01)
  *H01L 31/0216* (2014.01)
  *C09K 9/00* (2006.01)

(56) References Cited

U.S. PATENT DOCUMENTS

| | | |
|---|---|---|
| 2002/0037421 A1 | 3/2002 | Arnaud et al. |
| 2003/0054177 A1 | 3/2003 | Jin |
| 2011/0075243 A1* | 3/2011 | Moon et al. ............ 359/288 |
| 2011/0260123 A1* | 10/2011 | Granqvist et al. ............ 252/583 |
| 2012/0107687 A1* | 5/2012 | Ishida et al. ............ 429/217 |
| 2013/0101848 A1* | 4/2013 | Banerjee et al. ............ 428/402 |

FOREIGN PATENT DOCUMENTS

| | | | |
|---|---|---|---|
| DE | 69910322 T2 | 8/2004 | |
| EP | 994081 A1 | 4/2000 | |
| GB | 2114965 A | 9/1983 | |
| WO | WO/2010/038202 * | 4/2010 | ............ C09K 9/00 |

OTHER PUBLICATIONS

Mlyuka et al., "Thermochromic VO2-based multilayer films with enhanced luminous transmittance and solar modulation", Phys. Status Solidi A, vol. 26, No. 9, 2009, pp. 2155-2160.*

International Search Report in corresponding PCT/EP2013/062770 dated Nov. 11, 2013.

* cited by examiner

| Sample number | Concentration of Ca (in at%) | Concentration of W (in at%) | Switching temperature (in °C) | Absorption edge (in eV) | (in nm) | Transmittance (in %) at 20°C | at 100°C |
|---|---|---|---|---|---|---|---|
| W2 | 0 | 0.4 | 41.3 | 2.67 | 464 | 31.2 | 24.1 |
| Ca27 | 3.3 | 0 | 54.6 | 2.75 | 451 | 35.1 | 27.9 |
| Ca48 | 9.2 | 0 | 53.1 | 3.03 | 409 | 55.8 | 48.3 |
| WCa5 | 3.3 | 0.4 | 34.6 | 2.73 | 454 | 32.5 | 26.8 |
| WCa2 | 9.2 | 0.8 | 25.2 | 3.03 | 409 | 39.1 | 33.7 |

Fig. 4

THERMOCHROMIC GLASS COMPRISING A COATING OF NEUTRAL-COLOUR VANADIUM DIOXIDE

DESCRIPTION AND INTRODUCTION OF THE GENERAL FIELD OF THE INVENTION

The invention relates to a thermochromic glass coating and to a method for production thereof. Such thermochromic coatings have a transmittance for electromagnetic radiation that changes with temperature, for example IR, VIS, UV, and are to be used in building construction as glass window or glass façade coatings in order to influence the climate in the building interior and to save energy.

PRIOR ART

A glass coating made of vanadium dioxide $VO_2$ with alkali metal doping has been described in DE69910322T2. The vanadium dioxide has a phase transition at approximately 68° C. Above this temperature, it is present as metal phase and reflects electromagnetic radiation, particularly in the infrared spectral range (500 to 2000 nm). Below this temperature, a semi-conducting phase is present and allows infrared radiation to pass through. This is referred to as thermochromic effect. The phase transfer temperature can be reduced by doping with tungsten. The transmittance for visible light, however, is worsened, but can be increased by means of fluorine doping. However, the switching characteristics are worsened in the case of doping with fluorine.

Vanadium dioxide has a bronze colouring. This is particularly disadvantageous since this colouring acts as a filter for visible light. The transmission in the visible range of electromagnetic radiation is thus considerably restricted. The above-mentioned document does not give any solution for this, since the colouring cannot be prevented either by the layer thickness or by further layers.

In DE3347918C2 the reduction of vanadium dioxide to vanadium trioxide $V_2O_3$ is proposed, which is grey. Vanadium trioxide has a phase transition at 168 K and is therefore unsuitable for use as a thermochromic window glass coating. A suitable phase transition lies in the range of 300 K to 373 K.

In both documents the vanadium dioxide layer is applied by CVD.

However, this is disadvantageous in the case of gaseous fluorine doping, since an effective fluorine incorporation into the vanadium dioxide crystal lattice is not possible at deposition temperatures of more than 600° C. On the other hand, only an amorphous layer of vanadium dioxide can be deposited at an excessively low temperature (<400° C.), and this has only poor switching characteristics. It is therefore important to produce a crystalline layer of vanadium dioxide.

Problem

The problem addressed by the present invention is to overcome or to avoid the disadvantages of the prior art.

Solution to the Problem

This problem is solved in accordance with the invention by a glass coating, wherein the coating comprises vanadium dioxide. This vanadium dioxide layer is preferably doped with tungsten and/or fluorine. The discolouration of the vanadium dioxide is achieved by a doping with alkaline earth elements, such as calcium (Ca), strontium (Sr) and barium (Ba), individually or in combination. This doping of the vanadium dioxide layer with the alkaline earth elements is performed directly in the vanadium dioxide or additionally by doping with tungsten, fluorine or other elements (for example alkali metals—group 1: Li, Na, K, Rb, Cs, elements of groups 3, 4 and 5—for example B, Al, Ga, In, Si, Ge, Sn, Pb, P, As, Sb, Bi and transition metals, apart from Mg, Ca, Sr, Ba).

With the co-doping with tungsten and calcium, it has been found that a synergy of both above-described effects is attained. This means that on the one hand the switching temperature $T_C$ is lowered into the region of room temperature. On the other hand, the incorporation of calcium with the coatings thus produced leads to an increase of the degree of light transmission, in particular in the visible spectral range, wherein the light absorption edge experiences a blue shift. The optical appearance of such a coating changes with increasing calcium concentration from a bronze to a neutral colour appearance.

The tungsten concentration with the thermochromic coatings according to the present invention lies in the range from 0.01 to 3.0 atomic percent, preferably 0.4 to 2.6 atomic percent.

The concentration of an alkaline earth metal of the group consisting of Ba, Sr and Ca, preferably calcium, lies in the range from 0.01 to 15 atom percent, preferably 1.0 to 10.0 atom percent.

The fluorine concentration lies in the range from 0.01 to 2.0 atom percent, preferably 0.5 to 1.5 atom percent.

The vanadium dioxide layer has a thickness from 10 to 300 nm, preferably in the range from 40 to 100 nm.

A crystal seed layer is preferably inserted between the glass and the vanadium dioxide layer and promotes the crystallisation of the vanadium dioxide layer, even at low temperatures (<400° C.). Titanium dioxide or silicon oxide, preferably titanium dioxide, is used for this purpose.

The crystal seed layer (also intermediate layer (has a thickness from 5 to 200 nm, preferably in the range from 10 to 70 nm.

A post-oxidation of the doped vanadium dioxide layer with W or F or an alkaline earth metal of the group comprising Ba, Sr and Ca or the co-doped vanadium dioxide layer with W or F and an alkaline earth metal of the group comprising Ba, Sr and Ca can be prevented by a covering layer. A covering layer made of the compounds aluminium oxynitride, zinc oxysulfide, zinc oxide and zinc sulphide, individually and in in combination, is thus applied. This covering layer is additionally used as an anti-reflection layer, whereby the degree of light transmission additionally improves.

It has been found that it is advantageous if the covering layer has a thickness from 10 to 300 nm, preferably 40 to 100 nm.

Method for Producing the Layer

The vanadium dioxide layer is deposited by means of a sputtering method, preferably by means of a high-frequency or radiofrequency cathode sputtering method or DC cathode sputtering method. Alternatively, a coating can be achieved via CVD, other PVD methods or sol-gel methods, moreover in a plasma-assisted manner. Targets of the elements, element oxides or element fluorides of vanadium, tungsten, calcium, strontium and barium, individually or in combination, are also used. The transfer of the elements to the glass as carrier can therefore be performed in an argon-oxygen atmosphere. Here, the ratio of the mass flows of the gases of argon and oxygen to one another is preferably in the range from 5.7 to 1.4.

With additional gaseous fluorine doping, tetrafluoromethane ($CF_4$) or trifluoromethane ($CHF_3$) is added to the argon. Here, the ratio of the mass flows of the gases of argon, oxygen and $CF_4$ to one another is preferably in the range from 5.7 to 1.4 to 0.3. Similar ratios apply with the addition of other fluorination agents, such as $CHF_3$.

Alternatively, the fluorinated elements, for example calcium fluoride, strontium fluoride and/or barium fluoride are used as substrates. A use of fluorinated elements and fluorine-containing gas also constitutes one embodiment.

With a deposition temperature from room temperature to 400° C., the glass is first coated with a titanium dioxide layer as crystal seed layer, and a vanadium dioxide layer with the dopings is then applied.

The doped vanadium dioxide layer is preferably in turn coated with a cover layer that is preferably formed as an anti-reflection layer.

The thermochromic layer is used for glass (for example window glass, glass tubes, drinking glasses), plastics, textiles, solar cells (photovoltaics) and solar collectors (hot water preparation).

The embodiment according to the invention is explained hereinafter, wherein the invention comprises all the preferred embodiments presented hereinafter, individually and in combination.

EXEMPLARY EMBODIMENTS

FIG. 1 shows the basic structure, according to the present invention, of a thermochromic coating 10, as can be applied for example to a window glass pane 12. To this end, a titanium oxide layer 14 is deposited onto a glass substrate 12 by means of reactive high-frequency or radiofrequency sputtering. The titanium oxide layer thus produced forms a crystal ceramic layer on the glass substrate 12.

The power of the high-frequency generator during sputtering lies, in the case of the deposition of the titanium oxide layer, preferably in a range from 100 to 600 W (corresponding to 1.2 to 7.4 W/cm²), most preferably at 300 W (corresponding to 3.7 W/cm²). The deposition temperature lies preferably in the range from room temperature to 600° C., most preferably at approximately 300° C.

A vanadium dioxide layer is then applied to the titanium dioxide layer from a tungsten- or calcium-containing vanadium target or vanadium oxide target by means of reactive high-frequency or radiofrequency cathode sputtering. The vanadium dioxide layer 16 is the thermochromic layer. The layer contains approximately 3.3% Ca with 0.2% W and 0.3% F, the rest being formed by $VO_2$. Alternatively, the coating contains 8.9% Ca with 0.4% W, the rest being formed by $VO_2$. In addition, a coating with 8.9% Ca, the rest being formed by $VO_2$, has been produced. In addition, a coating with approximately 9% Sr, the rest being formed by $VO_2$, has been produced. In addition, a coating with approximately 9% Ba, the rest being formed by $VO_2$, has been produced.

The power of the high-frequency generator during sputtering lies, in the case of the deposition of the doped vanadium dioxide layer, preferably in the range from 100 to 600 W (corresponding to 1.2 to 7.4 W/cm²), most preferably at 300 W (corresponding to 3.7 W/cm2), whereas the deposition temperature preferably lies in the range from 100 to 600° C., most preferably at approximately 400° C.

A vanadium dioxide layer co-doped with fluorine and an alkaline earth metal of the group comprising Ba, Sr and Ca, or a vanadium dioxide layer co-doped with tungsten and an alkaline earth metal of the group comprising Ba, Sr and Ca, contains the following formulas for the thermochromic layer, wherein M denotes the corresponding alkaline earth metal:

$$V_{1-X-Y}W_XM_YO_2 \qquad \text{a)}$$

$$V_{1-Y}M_YO_{2-Z}F_Z \qquad \text{b)}$$

Alternatively, a tri-doped vanadium dioxide layer with fluorine, tungsten and an alkaline earth metal of the group comprising Ba, Sr and Ca is produced. The composition can be described by the following formula, wherein M denotes the alkaline earth metal:

$$V_{1-X-Y}W_XM_YO_{2-Z}F_Z \qquad \text{c)}$$

Dopings with further elements lead to other formulas and weight ratios.

A covering layer or cover layer 18 likewise deposited by means of high-frequency cathode sputtering and preferably consisting of zinc sulfide is then applied to the thermochromic doped vanadium dioxide layer 16. Furthermore, aluminium oxynitride, aluminium nitride, aluminium oxide, zinc oxysulfide or zinc oxide or mixed phases of these compounds (including zinc sulphide) are also used instead of zinc sulphide. This covering layer 18 is used to protect the thermochromic layer 16 against post-oxidation and as an anti-reflection layer, whereby the light transmittance is increased, particularly in the visible spectral range.

The power of the high-frequency generator during sputtering lies, in the case of the deposition of the zinc sulphide covering layer, preferably in the range from 100 to 600 W (corresponding to 1.2 to 7.4 W/cm²), most preferably at 200 W (corresponding to 2.5 W/cm²), whereas the deposition temperature preferably lies in the range from room temperature to 400° C., most preferably at room temperature.

Figure 2:
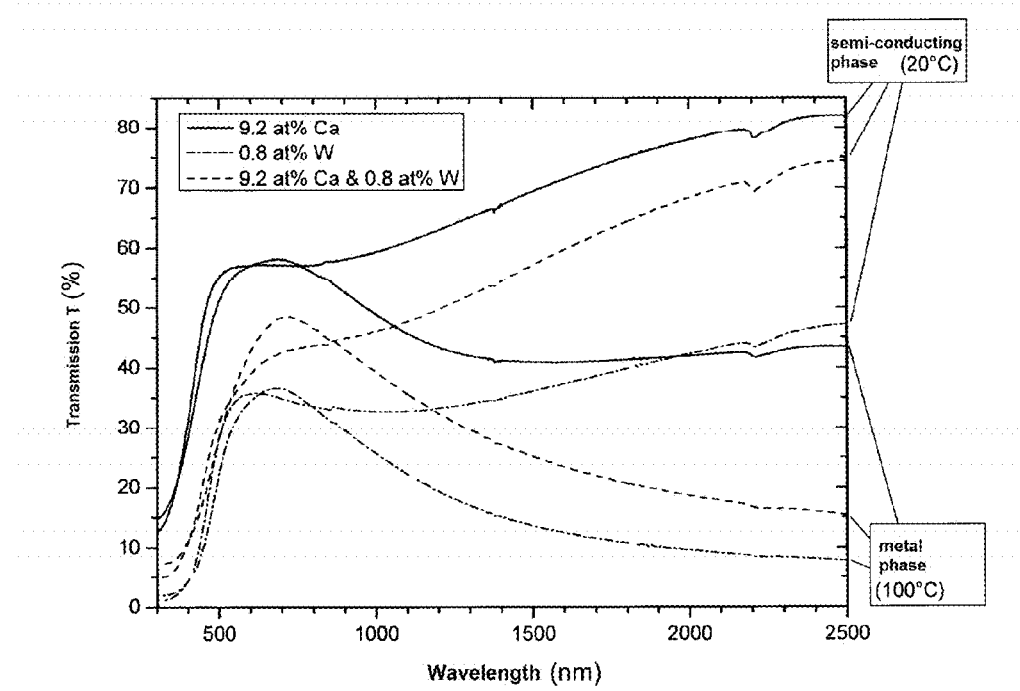

FIG. 2 shows the wavelength-dependent transmission behaviour for a vanadium dioxide layer 16 doped with calcium or co-doped with tungsten and calcium and deposited on glass using a high-frequency cathode sputtering system, without anti-reflection top layer. In addition, a vanadium dioxide layer doped merely with tungsten is shown for comparison. The layers were produced at a deposition temperature of approximately 600° C. (without gaseous fluorine doping). The low-temperature phase measured at 20° C. and the high-temperature phase at 100° C. of the three layers can be seen. For the range from 300 to 2500 nm, the layer doped merely with calcium consistently has a much higher transmission compared with the layer doped merely with tungsten. Furthermore, the layer co-doped with calcium and tungsten demonstrates a lower transmission for the range from 300 to 2500 nm compared with the layer doped merely with calcium, but higher transmission compared with the layer doped merely with tungsten. In particular, the transmission difference between low-temperature and high-temperature phase is much greater compared with the other layers.

Figure 3:
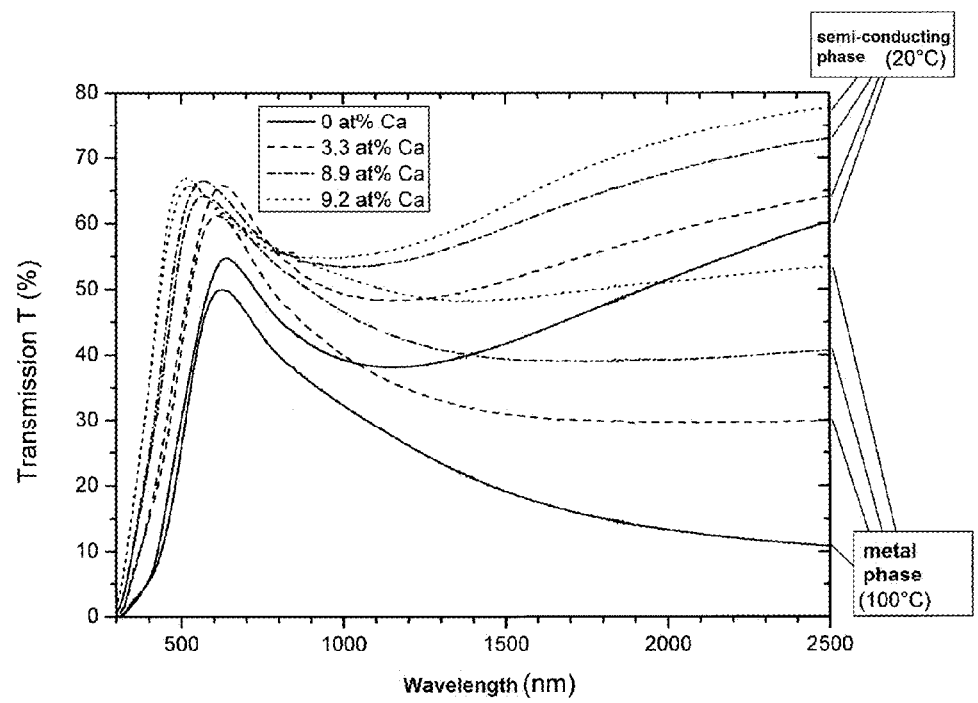

FIG. 3 shows the wavelength-independent transmission behaviour of vanadium dioxide layers 16 doped with different calcium concentrations using the high-frequency cathode sputtering system and having a titanium oxide intermediate layer 14 that is 20 nm thick, but without anti-reflection layer. The layers were produced at a deposition temperature of approximately 400° C. From the comparison of the curves, it can be seen that the transmittance for both phases is greater particularly in the range from 1000 to 2500 nm with rising calcium concentration. Furthermore, a blue shift of the absorption edge can be seen with rising calcium concentration, whereby the colour impression of the layers also changes from a bronze to a neutral colouration.

FIG. 4 shows a table which contains the switching temperatures, the absorption edges (band gaps) and the determined element concentration and also the spectral transmission degree of the high-temperature (measured at 100° C.) and low-temperature phase (measured at 20° C.) for different thermochromic coatings, wherein the same conditions for the layer production were applied as illustrated with the measured layers in FIG. 2.

As illustrated in the table, a synergy effect occurs with co-doping with tungsten and calcium, that is to say the co-doped layers have a shift of the switching temperature to lower temperatures caused primarily by the tungsten and also a shift of the absorption edge to higher energies or to lower wavelengths due to the doping with calcium.

Figure 5:
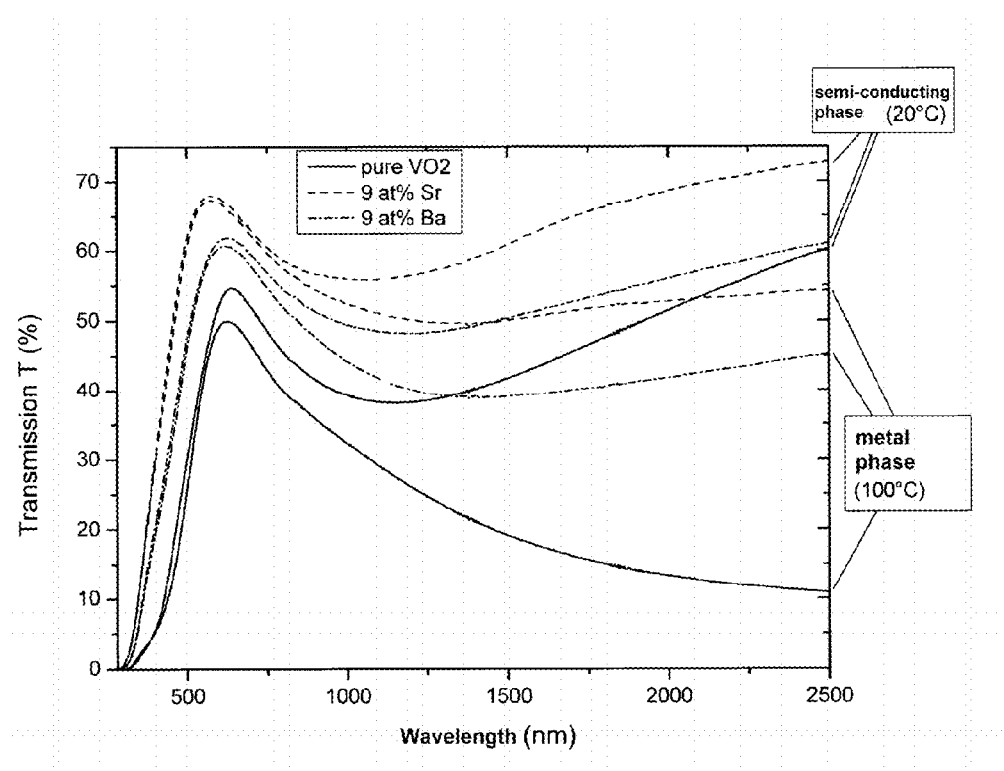

FIG. 5 shows the wavelength-dependent transmission behaviour for a vanadium dioxide layer 16 doped with strontium and with barium and also an undoped vanadium dioxide layer 16 deposited on glass using the high-frequency cathode sputtering system, without titanium oxide intermediate layer 14 and without anti-reflection top layer. The layers were produced at a deposition temperature of approximately 650° C. The determined barium and strontium concentrations lie at approximately 9 atomic percent.

Compared with the layer doped with calcium in FIG. 2, the layers from FIG. 5 doped with strontium and with barium demonstrate a similar switching behaviour. The transmission in the range from 300 to 2500 nm is much higher, and the absorption edge starts only at higher energies or lower wavelengths compared with the undoped vanadium dioxide layer in FIG. 5.

The increase of the transmittance, particularly in the blue spectral range, means that the optical appearance of the thermochromic coating is considerably improved compared with the vanadium dioxide layers known from the prior art doped merely with fluorine or tungsten, and the switching temperature shifts into the region of room temperature due to the simultaneous tungsten or fluorine incorporation. As can be seen in FIG. 3, the transmission of the thermochromic coating according to the invention indeed rises compared with the vanadium dioxide coating doped merely with tungsten, even in the high-temperature phase, however the transmission difference between high- and low-temperature phase remains approximately equal or even increases for sample Ca48 (see FIG. 4).

Textiles or plastics are coated at temperatures of approximately 100° C. to 200° C. with doped vanadium dioxide. In order to achieve a sufficiently good crystallinity of the vanadium dioxide and therefore of the thermochromic effect, the doped vanadium dioxide layer is to be applied to a crystal seed layer, wherein, besides sputtering, PVD or sol-gel methods can be used. In the case of sol-gel methods, a layer thickness that is as uniform as possible is to be ensured.

KEY TO THE FIGURES AND LIST OF REFERENCE SIGNS

FIG. 1 basic structure of a thermochromic coating for window glass according to the present invention;

FIG. 2 wavelength-dependent transmission spectrum of a thermochromic vanadium dioxide coating doped a) with Ca, b) with W and c) with W and Ca;

FIG. 3 wavelength-dependent transmission spectra of thermochromic vanadium dioxide coatings doped with different Ca concentrations;

FIG. 4 a table with switching temperatures and absorption edges (band gaps) of different thermochromic coatings based on vanadium dioxide;

FIG. 5 wavelength-dependent transmission spectra of thermochromic vanadium dioxide coatings doped with Ba and doped with Sr and also undoped.

The invention claimed is:

1. A thermochromic layer, which comprises vanadium dioxide, characterised in that the vanadium dioxide comprises a doping with at least one alkaline earth metal, wherein the alkaline earth metal is selected from the group consisting of calcium, barium and strontium.

2. The thermochromic layer according to claim 1, characterised in that the alkaline earth metal is calcium.

3. The thermochromic layer according to claim 1, characterised in that the vanadium dioxide layer has an additional doping with tungsten and/or fluorine.

4. The thermochromic layer according to claim 1, characterised in that the vanadium dioxide layer additionally has a crystal seed layer and/or a cover layer.

5. The thermochromic layer according to claim 1, comprising a crystal seed layer which comprises compounds selected from the group consisting of titanium dioxide and silicon oxide.

6. The thermochromic layer according to claim 1, comprising a cover layer which comprises compounds selected from the group consisting of aluminium oxynitride, zinc oxysulfide, zinc oxide and zinc sulphide.

7. A glass coated with a thermochromic layer according to claim 1.

8. A method for producing a thermochromic layer having a vanadium dioxide layer according to claim 1, characterised in that the vanadium dioxide layer is doped with alkaline earth metals.

9. The method for producing a thermochromic layer according to claim 8, characterised in that a carrier is coated with a thermochromic layer, by means of high-frequency or radiofrequency cathode sputtering methods or DC cathode sputtering methods.

10. A glass, plastic, textile, solar cell or solar collector coated with a thermochromic layer according to claim 1.

* * * * *